United States Patent [19]
Yoshida

[11] 4,181,895
[45] Jan. 1, 1980

[54] AMPLIFIER WITH MUTING CIRCUIT
[75] Inventor: Tadao Yoshida, Tokyo, Japan
[73] Assignee: Sony Corporation, Tokyo, Japan
[21] Appl. No.: 934,036
[22] Filed: Aug. 16, 1978
[30] Foreign Application Priority Data
Aug. 29, 1977 [JP] Japan .......................... 52/115398[U]
[51] Int. Cl.² .............................................. H03G 3/30
[52] U.S. Cl. .................................... 330/279; 330/51; 330/149
[58] Field of Search ...................... 330/51, 149, 207 P, 330/279, 298; 325/402, 403, 478; 179/1 A, 1 P
[56] References Cited
U.S. PATENT DOCUMENTS

| 3,828,267 | 8/1974 | Tsurushima | 330/51 X |
| 3,835,412 | 9/1974 | Honda et al. | 330/51 X |

Primary Examiner—James B. Mullins
Attorney, Agent, or Firm—Lewis H. Eslinger; Alvin Sinderbrand

[57] ABSTRACT

An amplifier comprises a signal amplifying circuit connected between a signal input terminal and a signal output terminal, a DC power supply, a voltage regulating circuit connected between the DC power supply and the amplifying circuit, a muting circuit connected between the amplifying circuit and the output terminal, and a detecting circuit for detecting a voltage difference between the input and output of the voltage regulating circuit and correspondingly controlling the muting circuit to mute the output signal from the amplifying circuit when the detected voltage difference becomes less than a predetermined value, for example, when the DC power supply is turned-off.

6 Claims, 3 Drawing Figures

AMPLIFIER WITH MUTING CIRCUIT

BACKGROUND OF THE INVENTION

1. Field of the Invention

This invention relates generally to amplifiers, and more particularly is directed to providing an improved muting circuit in an amplifier with a DC power supply.

2. Description of the Prior Art

It is known to provide an amplifier with a muting circuit for eliminating the "pop" noise that would otherwise issue from an associated speaker system when the power supply for the amplifier is turned off. In a conventional muting circuit for an amplifier, a power transformer thereof is provided with a detecting coil or winding from which a detecting signal is derived when the power supply is turned off, and such detecting signal is employed to cause the opening of a muting switch through which the output of the amplifier is otherwise transmitted to an output terminal and, thence, to the speaker system. However, the foregoing muting circuit arrangement is relatively costly in that it requires the use of a special power transformer in which there is provided the mentioned coil or winding for detecting when the power supply is turned off.

OBJECTS AND SUMMARY OF THE INVENTION

Accordingly, it is an object of the present invention to provide an improved amplifier with a muting circuit arrangement which avoids the above-mentioned disadvantages of existing muting arrangements.

Another object is to provide an amplifier with a muting circuit which is relatively inexpensive in that it does not require the use of a special power transformer with a detecting coil or winding included therein.

In accordance with an aspect of this invention, an amplifier comprises a signal amplifying circuit connected between signal input and output terminals, a DC power supply, a voltage regulating circuit having an input connected to the DC power supply and an output connected to the signal amplifying circuit, a muting circuit connected to the amplifying circuit for muting the output signal applied from the latter to the output terminal, and a detecting circuit for detecting a voltage difference between the input and output of the voltage regulating circuit and correspondingly controlling the muting circuit when the detected voltage difference becomes less than a predetermined value, for example, when the DC power supply is turned off.

The above, and other objects, features and advantages of the invention, will become apparent from the following detailed description of an illustrative embodiment thereof which is to be read in connection with the accompanying drawing.

DESCRIPTION OF A PREFERRED EMBODIMENT

Figure 1:
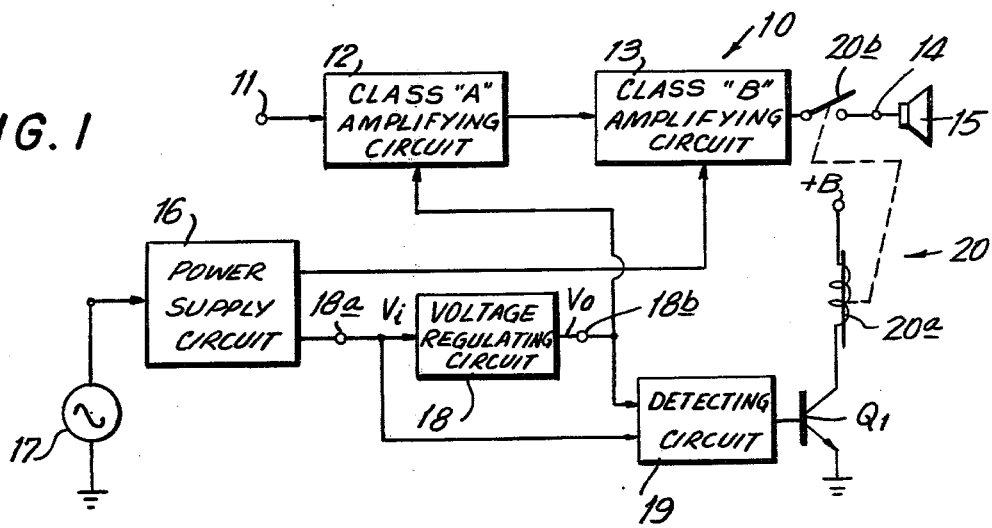
FIG. 1 is a block diagram schematically illustrating an amplifier provided with a muting circuit in accordance with an embodiment of this invention.

Referring to the drawings in detail, and initially to FIG. 1 thereof, it will be seen that an amplifier 10 having a muting circuit in accordance with this invention is there shown incorporated in an audio system which includes an audio signal input terminal 11, a signal amplifying circuit composed of a class A amplifying circuit 12 and a class B amplifying circuit 13 acting in succession on the audio input signal applied to terminal 11 for providing an amplified audio signal at an output terminal 14 to which a loudspeaker or speaker system 15 is connected. In order to operate or power the amplifying circuits 12 and 13, the illustrated amplifier 10 is shown to include a DC power supply circuit 16 which may be energized from a AC power source 17 so as to directly supply a suitable DC operating voltage to class B amplifying circuit 13, while the class A amplifying circuit 12 is powered by a regulated DC operating voltage supplied thereto from DC power supply circuit 16 by way of a voltage regulating circuit 18. More particularly, the input voltage $V_i$ applied from power supply circuit 16 to input terminal 18a of voltage regulating circuit 18 may have a normal value of about 15 V, while the output voltage $V_o$ applied from circuit 18 to output terminal 18b of the latter and thence to amplifying circuit 12 may be regulated to normally have a value of about 10 V.

Figure 2:
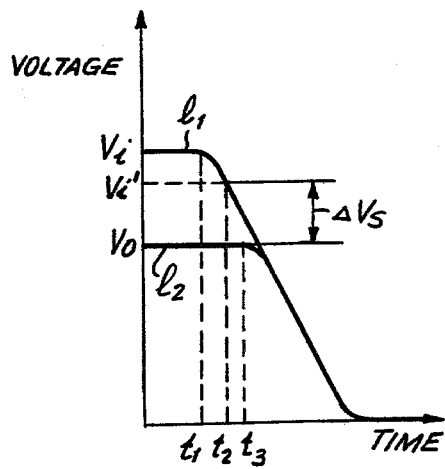
FIG. 2 is a graphic representation of the characteristics of the power supply voltages for a class A amplifying circuit and a class B amplifying circuit, respectively, included in the amplifier of FIG. 1.

As shown on FIG. 2, when the power source 17 is turned off or the output from power supply circuit 16 is otherwise interrupted at the time $t_1$, the input voltage $V_i$ to voltage regulating circuit 18 immediately goes down abruptly, as indicated by the curve $l_1$. However, due to the characteristics of voltage regulating circuit 18, the output voltage $V_o$ of such circuit does not decrease immediately from the time $t_1$, but rather maintains a substantially constant voltage until the time $t_3$ after which the voltage $V_o$ decreases in correspondence with the decreasing voltage $V_i$, as represented by the curve $l_2$.

Generally, in accordance with the present invention, the difference $\Delta V$ between the curves $l_1$ and $l_2$ representing the rates of decrease of the input voltage $V_i$ and of the output voltage $V_o$, respectively, of voltage regulating circuit 18 is used to control the muting circuit. More particularly, in the illustrated amplifier 10 according to this invention, a detecting circuit 19 detects the voltage difference between the input and output voltages $V_i$ and $V_o$ of regulating circuit 18 and provides a corresponding output signal to the base of a control transistor $Q_1$ for determining the state of the latter and thereby controlling the energizing of the coil 20a of a relay 20 which has its contacts 20b interposed between class B amplifying circuit 13 and output terminal 14. It will be apparent that relay 20 is effective to mute the output of amplifier 10 when its contacts 20b are opened.

In the illustrated arrangement according to the invention, control transistor $Q_1$ is shown to have its emitter grounded, while the coil 20a of relay 20 is connected between a DC power supply +B and the collector of transistor $Q_1$ so as to energize coil 20a and thereby close the normally open contacts 20b only when transistor $Q_1$ is turned on in response to the detection by circuit 19 of at least a predetermined voltage difference $\Delta V_s$ (FIG. 2) between voltages $V_i$ and $V_o$. It is to be noted that, with the illustrated arrangement, if the voltage difference $\Delta V$ between the input and output voltages $V_i$ and $V_o$ of voltage regulating circuit 18 becomes less than the predetermined voltage $\Delta V_s$, the corresponding output from detecting circuit 19 turns off transistor $Q_1$ so as to deenergize coil 20a of relay 20 and thereby open contacts 20b for achieving the muting function.

Figure 3:
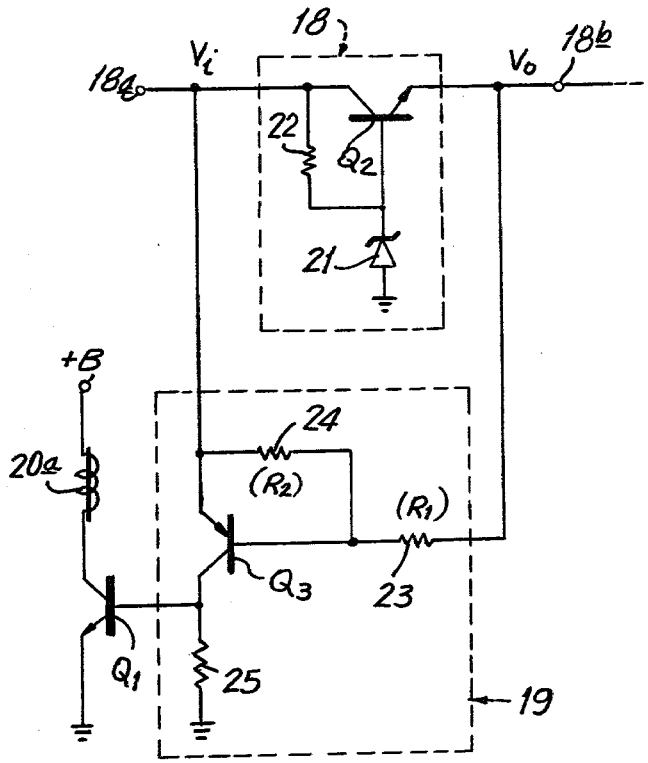
FIG. 3 is a circuit diagram showing details of several components of the amplifier shown on FIG. 1.

As shown on FIG. 3, the voltage regulating circuit 18 may comprise, as is conventional, a regulating transistor $Q_2$ having its collector-emitter path interposed, in series, between the input and output terminals 18a and 18b of the voltage regulating circuit, a zener diode 21 connected between the base of transistor $Q_2$ and ground, and a resistor 22 connected between the collector of transistor $Q_2$ and the junction of the base of transistor $Q_2$ with the zener diode 21.

As further shown on FIG. 3, the detecting circuit 19 may desirably include a detecting transistor $Q_3$ which is of the PNP-type in the illustrated embodiment, and which has its base connected to the output terminal 18b of voltage regulating circuit 18 through a resistor 23 having a resistance value $R_1$. The emitter of transistor $Q_3$ is shown to be directly connected to the input terminal 18a of voltage regulating circuit 18, and also to the base of transistor $Q_3$ by way of a resistor 24 having a resistance value $R_2$. It will be appreciated that the resistors 23 and 24 are connected in series between the output and input terminals 18b and 18a of regulating circuit 18, with a junction point between the series connected resistors 23 and 24 being connected to the base of transistor $Q_3$. Further, the collector of transistor $Q_3$ is connected to ground through a resistor 25 and also connected directly to the base of control transistor $Q_1$ for determining the state of the latter in dependence on the output of detecting circuit 19 derived from the collector of transistor $Q_3$.

It will be appreciated that transistor $Q_3$ is turned on, so as to turn on control transistor $Q_1$ for energizing relay coil 20a and thereby closing contacts 20b, only when the following relationship exists:

$$\Delta V \cdot R_2/(R_1+R_2) \geq V_{BE} \quad (1)$$

in which $\Delta V = V_i - V_o$ and $V_{BE}$ is the base-emitter voltage of transistor $Q_3$.

The above relationship may be rewritten as:

$$\Delta V \geq (R_1+R_2)/R_2 \cdot V_{BE} \quad (2)$$

If $(R_1+R_2)/R_2 \cdot V_{BE}$ is designated as $\Delta V_s$ and the value for $\Delta V_s$ is selected to be too close to the voltage difference existing between the input and output voltages $V_i$ and $V_o$ during normal operation, then $\Delta V$ may come within $\Delta V_s$, and cause a false or erroneous muting action, as a result of drifting of the input voltage $V_i$ when the power supply circuit 16 or power source 17 is initially turned on.

Therefore, the value of $\Delta V_s$ must be established or selected so that the drift of the input voltage $V_i$, as when the power source is initially turned on, will not cause the value of $\Delta V$ to come within the voltage difference $\Delta V_s$ during normal operation. For example, in the event that $V_i$ is 15 V and $V_o$ is 10 V, the value of $\Delta V$ is normally about 5 V and, therefore, the resistance values $R_1$ and $R_2$ of resistors 23 and 24 are selected to provide $\Delta V_s$ with a value of 3 V. More particularly, when $V_{BE}$ is 0.6 V, the resistance values $R_1$ and $R_2$ of resistors 23 and 24 may be selected to be 4 K$\omega$ and 1 K$\omega$, respectively, to provide $\Delta V_s = 3$ V.

Since the voltage difference $\Delta V$ is normally substantially larger than $\Delta V_s$, transistor $Q_3$ is turned on during normal operation with the result that control transistor $Q_1$ is also turned on for energizing coil 20a of relay 20 and thereby preventing the muting operation. In other words, during normal operation, relay contacts 20b are closed with the result that the amplified audio signal from class B amplifying circuit 3 is passed therethrough to output terminal 14 for operating speaker system 15.

If power supply circuit 16 is turned off, for example, by actuating a switch (not shown) for disconnecting source 17 from power supply circuit 16, at the time $t_1$, the input voltage $V_i$ of voltage regulating circuit 18 decreases along the curve $l_1$ while the output voltage $V_o$ decreases along the curve $l_2$. At the time $t_2$, the actual voltage difference $\Delta V$ between $V_i$ and $V_o$ becomes less than the predetermined difference $\Delta V_s$ and, therefore, at the time $t_2$, transistor $Q_3$ is turned off, with the result that control transistor $Q_1$ is also turned off so as to deenergize relay coil 20a and cause the opening of relay contacts 20b. The opening of relay contacts 20b provides a muting operation by which the amplifier output is isolated from speaker 15 to avoid the generation of a pop noise even though the output voltage $V_o$ of the voltage regulating circuit 18 is still maintained at its normal value at least in the interval from the time $t_2$ until the subsequent time $t_3$.

In the illustrated amplifier 10 embodying this invention, the DC power supply circuit 16 therefor has been shown to be energized from an AC source 17. However, it will be apparent that the present invention can be similarly applied to any other DC operated amplifier, for example, in a car radio or a portable radio, in which a battery constitutes the DC power supply. It will also be apparent that the relay 20 functioning as a muting switch in the described circuit 10 could be replaced by a similarly acting switching transistor and further that the polarities of the transistors $Q_1$ and $Q_3$ can be other than the polarities indicated in FIG. 3 so that, for example, the muting operation is obtained when the transistor $Q_1$ is turned on.

Having described an illustrative embodiment of the invention with reference to the accompanying drawing, it is to be understood that the invention is not limited to that precise embodiment or the specific modifications thereof mentioned above, and that various changes and further modifications may be effected therein by one skilled in the art without departing from the scope or spirit of the invention as defined in the appended claims.

What is claimed is:

1. An amplifier comprising: a signal input terminal; a signal output terminal; a signal amplifying circuit connected between said signal input and output terminals; a DC power supply; a voltage regulating circuit having an input connected to said DC power supply, and an output connected to said signal amplifying circuit; switching means connected to said signal amplifying circuit for muting the output signal from the latter; and detecting circuit means for detecting a voltage difference between said input and output of said voltage regulating circuit and for controlling said switching means in accordance with the detected voltage difference.

2. An amplifier according to claim 1; wherein said amplifying circuit includes a first amplifying stage operated by a DC voltage from said output of said voltage regulating circuit and a second amplifying stage operated by a DC voltage from said DC power supply.

3. An amplifier according to claim 2; wherein said first amplifying stage is constituted by a class A amplifying circuit and said second amplifying stage is constituted by a class B amplifying circuit.

4. An amplifier according to claim 1; wherein said switching means is connected between said amplifying circuit and said signal output terminal.

5. An amplifier according to claim 4; wherein said switching means includes a relay having contact means connected between said amplifying circuit and said signal output terminal and a coil, and a control transistor having a pair of output electrodes and an input electrode, one of said pair of output electrodes being connected to said coil, the other of said pair of output electrodes being grounded and said input electrode being connected to said detecting circuit means.

6. An amplifier according to claim 1; wherein said detecting circuit means includes first and second resistors connected in series between said input and output of said voltage regulating circuit, a transistor having an emitter, a base, and a collector, said emitter being connected to said input of the voltage regulating circuit, said base being connected to a junction between said first and second resistors, and a third resistors through which said collector is connected to the ground, said collector being also connected to said switching means.

* * * * *